(12) United States Patent
Otsubo

(10) Patent No.: US 6,728,287 B2
(45) Date of Patent: Apr. 27, 2004

(54) SURFACE EMITTING SEMICONDUCTOR LASER DEVICE CAPABLE OF IMPROVING HEAT RADIATION EFFICIENCY AND ITS MANUFACTURE METHOD

(75) Inventor: Koji Otsubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 287 days.

(21) Appl. No.: 09/978,570

(22) Filed: Oct. 18, 2001

(65) Prior Publication Data

US 2002/0094001 A1 Jul. 18, 2002

(30) Foreign Application Priority Data

Jan. 17, 2001 (JP) .................................. 2001-009003

(51) Int. Cl.[7] .............................................. H01S 5/183
(52) U.S. Cl. .............................................. 372/96; 372/99
(58) Field of Search ..................................... 372/96, 99

(56) References Cited

U.S. PATENT DOCUMENTS 6,359,920 B1 * 3/2002 Jewell et al. ................. 372/46
6,628,685 B1 * 9/2003 Shieh .......................... 372/45

* cited by examiner

Primary Examiner—James Davie
(74) Attorney, Agent, or Firm—Armstrong, Kratz, Quintos, Hanson & Brooks, LLP

(57) ABSTRACT

A lower multi-layer mirror is disposed on a substrate made of a first semiconductor having a first lattice constant. The lower multi-layer mirror has a lamination structure that a first layer made of an oxide of a second semiconductor and a second layer made of a third semiconductor are alternately stacked. A strain-relaxation layer is disposed on the lower multi-layer mirror, the strain-relaxation layer being made of a fourth semiconductor having a second lattice constant different from the first lattice constant. An active layer is disposed on the strain-relaxation layer. The active layer including a luminescence region is made of a fifth semiconductor having a third lattice constant different from the first and second lattice constants. An upper multi-layer mirror is disposed on the active layer. A surface-emitting semiconductor laser is provided which has a high efficiency and a low heat resistance.

5 Claims, 5 Drawing Sheets

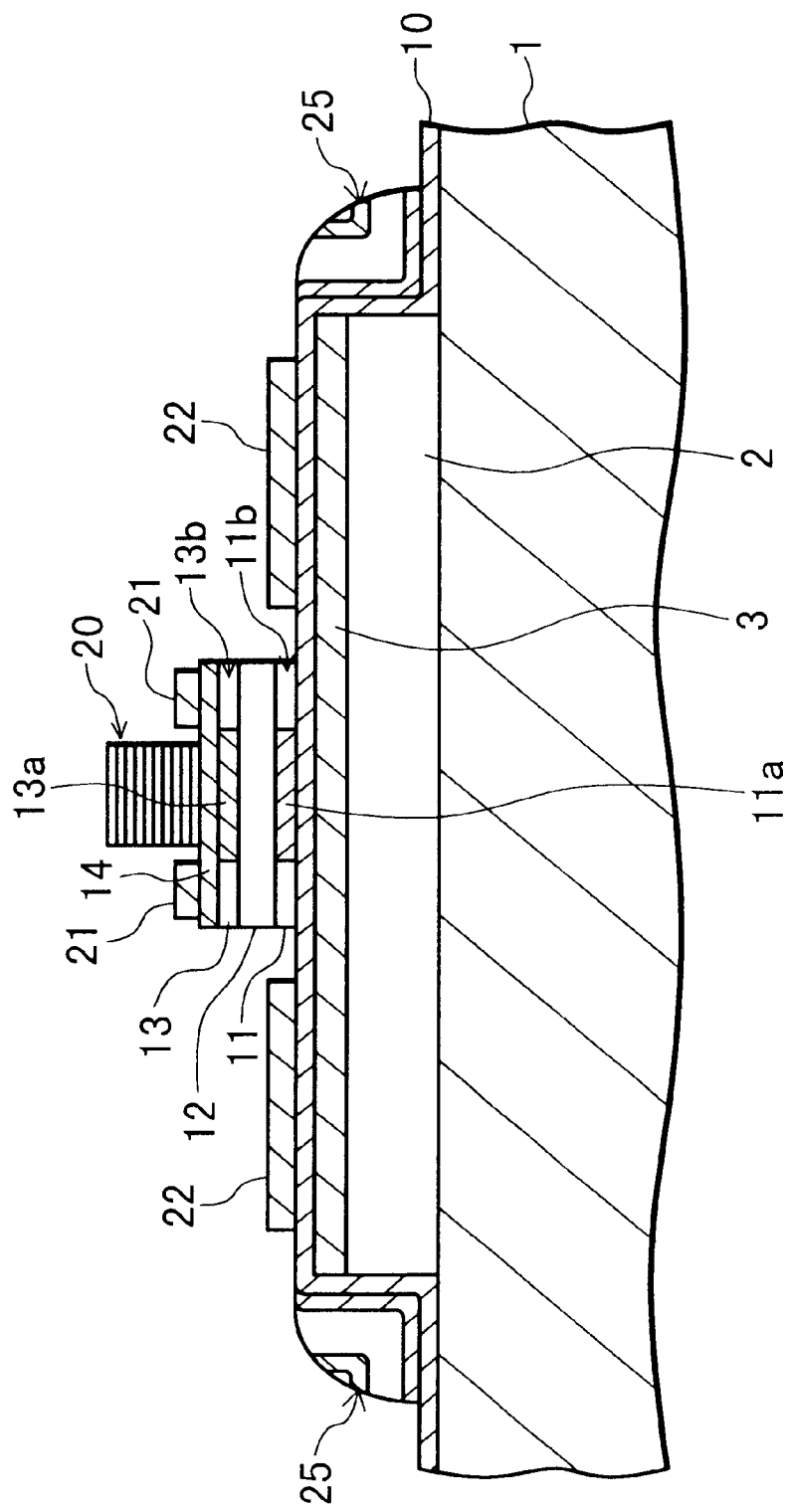

SURFACE EMITTING SEMICONDUCTOR LASER DEVICE CAPABLE OF IMPROVING HEAT RADIATION EFFICIENCY AND ITS MANUFACTURE METHOD

This application is based on Japanese Patent Application 2001-009003, filed on Jan. 17, 2001, the entire contents of which are incorporated herein by reference.

BACKGROUND OF THE INVENTION

A) Field of the Invention

The present invention relates to a surface emitting semiconductor laser device and its manufacture method, and more particularly to a surface emitting semiconductor laser device suitable for laser oscillation at a wavelength longer than 1 μm and its manufacture method.

B) Description of the Related Art

A high gain strained quantum well layer having an oscillation wavelength of 1 μm or longer and a high reflectivity semiconductor DBR mirror can be formed by using an InGaAs substrate. A surface emitting semiconductor laser device of a 1 μm band has been proposed which has a strained quantum well layer of GaInNAs or GaAsSb formed on a GaAs substrate.

If InGaAs is used as a substrate material, the material of a semiconductor DBR mirror and a laser structure to be formed on the InGaAs substrate is usually ternary or quarternary compound semiconductor. If compound semiconductor made of three or more atoms, there is some fear of a high heat resistance of a laser device.

If GaAs is used as a substrate material, a highly efficient DBR mirror can be manufactured by alternately laminating a GaAs layer and an AlAs layer. However, it is difficult to improve the quality of a strained quantum well layer made of GaInNAs, GaAsSb or the like and a surface emitting semiconductor laser device having a low threshold value is not realized as yet.

SUMMARY OF THE INVENTION

It is an object of the present invention to provide a surface emitting semiconductor laser device having a high efficiency and a low thermal resistance and being suitable for laser oscillation at a wavelength of 1 μm or longer and its manufacture method.

According to one aspect of the present invention, there is provided a surface emitting semiconductor laser device, comprising: a substrate made of a first semiconductor having a first lattice constant; a lower multi-layer mirror disposed on a surface of the substrate, the lower multi-layer mirror having a first layer made of a second semiconductor oxidized and a second layer made of a third semiconductor alternately stacked; a strain relaxation layer disposed on the lower multi-layer mirror and made of a fourth semiconductor having a second lattice constant different from the first lattice constant; an active layer including a luminescence region disposed on the strain relaxation layer and made of a fifth semiconductor having a third lattice constant different from the first lattice constant; and an upper multi-layer mirror disposed on the active layer.

According to another aspect of the present invention, there is provided a method of manufacturing a surface emitting semiconductor laser, comprising the steps of: forming a first lamination structure on a surface of a substrate made of a first semiconductor having a first lattice constant, the first lamination structure being made of a first layer made of a second semiconductor and a second layer made of a third semiconductor alternately stacked; growing a strain relaxation layer on the first lamination structure, the strain relaxation layer being made of a fourth semiconductor having a second lattice constant different from the first lattice constant; patterning the first lamination structure and the strain relaxation layer to expose side faces of each layer; oxidizing the first layers from side faces thereof under a condition that the first layers are oxidized and the second layers and the strain relaxation layer are not oxidized; forming an active layer on the strain relaxation layer, the active layer including a luminescence region and being made of a fifth semiconductor having a third lattice constant different from the first lattice constant; and forming an upper multi-layer on the active layer.

As the first layer is oxidized, strains in the upper strain relaxation layer are relaxed more than the strains immediately after the growth of the strain relaxation layer. By growing the active layer on the strain relaxation layer whose strains were relaxed, the quality of the active layer can be improved. By inserting the strain relaxation layer between the substrate and active layer, the selection degree of freedom of substrate materials becomes high. It is therefore possible to use binary compound semiconductor having a small heat resistance as the material of a substrate.

BRIEF DESCRIPTION OF THE DRAWINGS

FIG. 1 is a cross sectional view of a surface emitting semiconductor laser device according to an embodiment of the invention.

DETAILED DESCRIPTION OF THE PREFERRED EMBODIMENTS

Figure 2A:
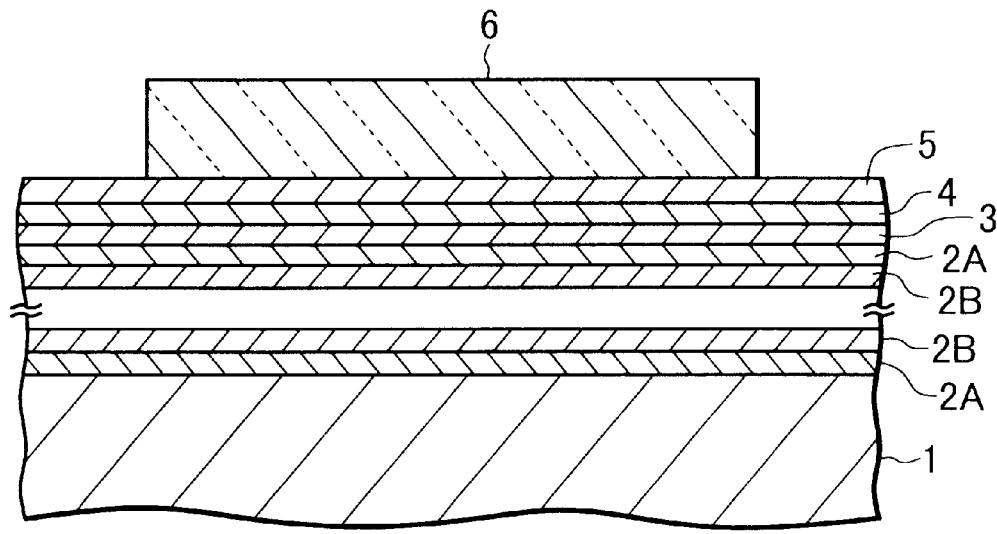
FIGS. 2A to 2H are cross sectional views of a substrate illustrating a method of manufacturing a surface emitting semiconductor laser device according to an embodiment of the invention.

FIG. 1 is a cross sectional view of a surface emitting semiconductor laser device according to an embodiment of the invention. On the surface of a GaAs substrate 1, a lower DBR mirror 2 is formed. The lower DBR mirror 2 has a lamination structure that a GaAs layer of 95 nm in thickness and an $Al_2O_3$ layer of 191 nm in thickness are alternately stacked. The $Al_2O_3$ layer is formed by oxidizing AlAs. The number of GaAs layers is five, and the number of $Al_2O_3$ layers is six. Namely, the uppermost and lowermost layers are both the $Al_2O_3$ layer.

On the lower DBR mirror 2, a strain relaxation layer 3 of $In_{0.27}Ga_{0.73}As$ is formed which has a thickness of 70 nm. The plan shape of the lower DBR mirror 2 and strain relaxation layer 3 is, for example, a square having a side length of 100 μm. The conductivity type of the GaAs substrate 1, the GaAs layer of the lower DBR mirror 2, and the strain relaxation layer 3 may be any one of an n-type, a p-type, and an i-type (doped with no impurities).

A p-side contact layer 10 is formed covering the surfaces of the GaAs substrate 1, lower DBR mirror 2 and strain relaxation layer 3. The p-side contact layer 10 is made of Zn-doped p-type $In_{0.27}Ga_{0.73}As$ and has a thickness of 209 nm, the Zn concentration being $2\times10^{18}$ cm$^{-3}$.

A lower current confinement layer 11, an active layer 12, an upper current confinement layer 13 and an n-side contact layer 14 are stacked in this order on the upper surface of the p-side contact layer 10 in the area above a generally central area of the strain relaxation layer 3. The plan shape of this lamination structure is, for example, a square having a side length of 30 µm.

The lower current confinement layer 11 is made of Zn-doped p-type $In_{0.256}Al_{0.744}As$ and has a thickness of 106 nm, the Zn concentration being $2\times10^{18}$ cm$^{-3}$. The upper current confinement layer 13 is made of Si-doped n-type $In_{0.256}Al_{0.744}As$ and has a thickness of 106 nm, the Si concentration being $2\times10^{18}$ cm$^{-3}$. The region near the outer peripheries of the lower and upper current confinement layers 11 and 13 are laterally oxidized from the side faces by about 10 µm to form insulating regions 11b and 13b. In the central areas of the current confinement layers 11 and 13, a p-type conductive region 11a and an n-type conductive region 13a are left.

The active layer 12 has a five-layer structure including two strained quantum well layers (luminescence regions) separated by a barrier layer, and two separation confinement hetero (SCH) layers disposed on the two strained quantum well layers. Each strained quantum well layer is made of i-type $In_{0.45}Ga_{0.55}As$ and has a thickness of 8 nm. The barrier layer and SCH layer are both made of i-type $In_{0.266}Al_{0.218}Ga_{0.516}As$, the barrier layer has a thickness of 10 nm and the SCH layer has a thickness of 178 nm.

The n-side contact layer 14 is made of Si-doped n-type $In_{0.27}Ga_{0.73}As$ and has a thickness of 279 nm, the Si concentration being $2\times10^{18}$ cm$^{-3}$.

An upper DBR mirror layer 20 is formed on the upper surface of the n-side contact layer 14 in generally the central area thereof. The upper DBR mirror 20 has a lamination structure that a Si layer of 85 nm in thickness and an $Al_2O_3$ layer of 191 nm in thickness are alternately stacked five times.

A p-side electrode 22 is formed on the upper surface of the p-side contact layer 10 in a frame-shaped area surrounding the lower current confinement layer 11. The p-side electrode 22 has a two-layer structure of a AuZn alloy layer in ohmic contact with the p-side contact layer 10 and an Au layer formed on the AuZn alloy layer. An n-side electrode 21 is formed on the upper surface of the n-side contact layer 14 in a frame-shaped area surrounding the upper DBR mirror 20. The n-side electrode 21 has a two-layer structure of a AuGe alloy layer in ohmic contact with the n-side contact layer 14 and an Au layer formed on the AuGe alloy layer.

A sidewall structure 25 is left on the sidewalls of the lower DBR mirror 2 and strain relaxation layer 3. This sidewall structure 25 is made of etching residue when the lamination structure from the lower current confinement layer 11 to the n-side contact layer 14 was patterned.

Next, with reference to FIGS. 2A to 2H, the manufacture method for the surface emitting semiconductor laser device shown in FIG. 1 will be described.

As shown in FIG. 2A, on the surface of a GaAs substrate 1, an AlAs layer 2A of 191 nm in thickness and a GaAs layer 2B of 95 nm in thickness are alternately stacked until six AlAs layers 2A and five GaAs layers 2B are formed. On this lamination structure, a strain relaxation layer 3 of $In_{0.27}Ga_{0.73}As$ having a thickness of 70 nm, an AlAs layer 4 of AlAs having a thickness of 5 nm and a protective layer 5 of GaAs having a thickness of 20 nm are grown. These layers are grown by molecular beam epitaxy (MBE) or metal organic vapor phase epitaxy (MOVPE).

On the surface of the protective film 5, a mask pattern 6 is formed which is made of silicon oxide having a thickness of 200 nm. The plan shape of the mask pattern is a square having a side length of 100 µm. The mask pattern 6 is formed by forming a silicon oxide film by plasma enhanced chemical vapor deposition (PECVD) and patterning the silicon oxide film by buffered hydrofluoric acid.

Figure 2B:
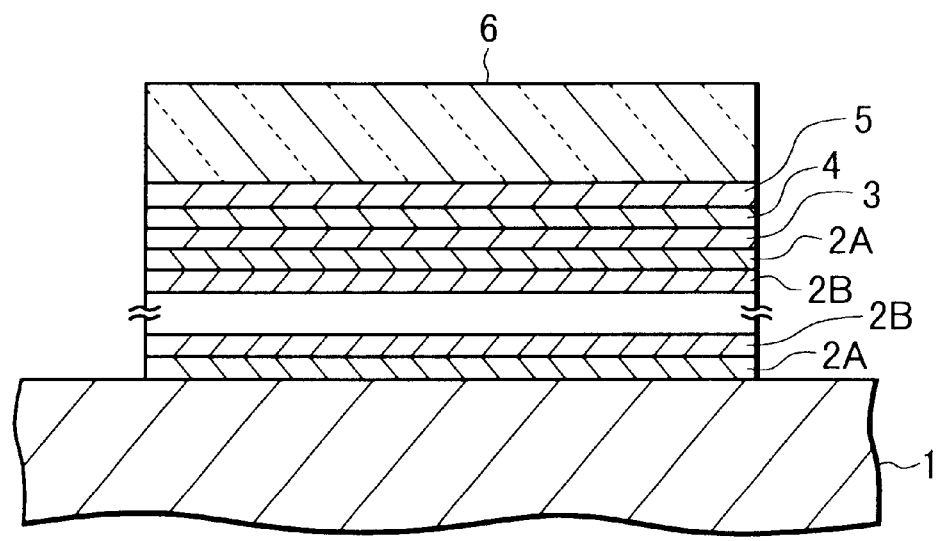

As shown in FIG. 2B, by using the mask pattern 6 as a mask, the lamination structure from the protective layer 5 to the AlAs layer 2A nearest to the substrate is etched. This etching can be performed by reactive ion beam etching (RIBE) using chlorine gas.

Figure 2C:
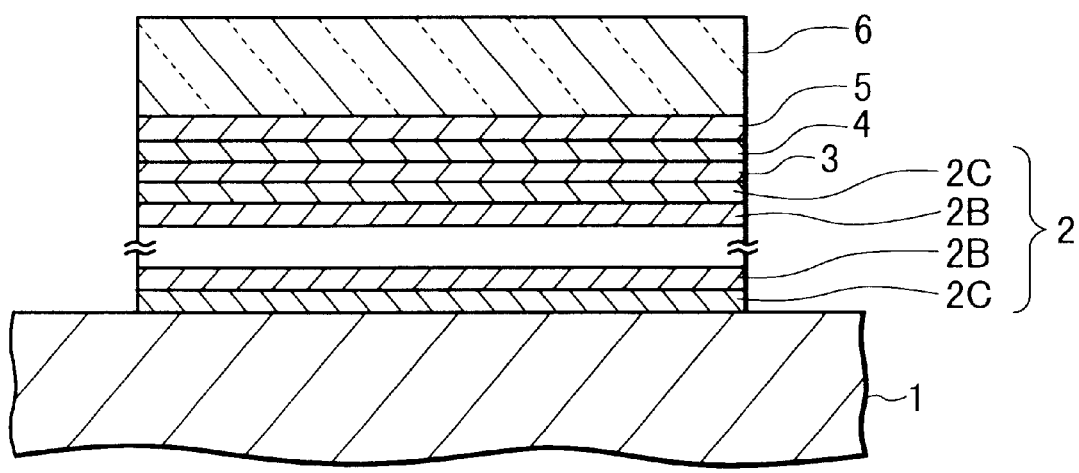

The processes up to the state shown in FIG. 2C will be described. After the lamination structure from the protective layer 5 to the AlAs layer 2A nearest to the substrate was etched, the substrate is placed in a reaction furnace and heated to 400° C. Water vapor is introduced into the reaction furnace by using nitrogen gas as carrier gas. Only the AlAs layers 2A are selectively oxidized in the lateral direction from the side faces thereof to form $Al_2O_3$ layers 2C. The etching stopper layer 4 of AlAs is very thin so that it is rarely oxidized. The alternately laminated $Al_2O_3$ layers 2C and GaAs layers 2B constitute a lower DBR mirror 2.

Figure 2D:
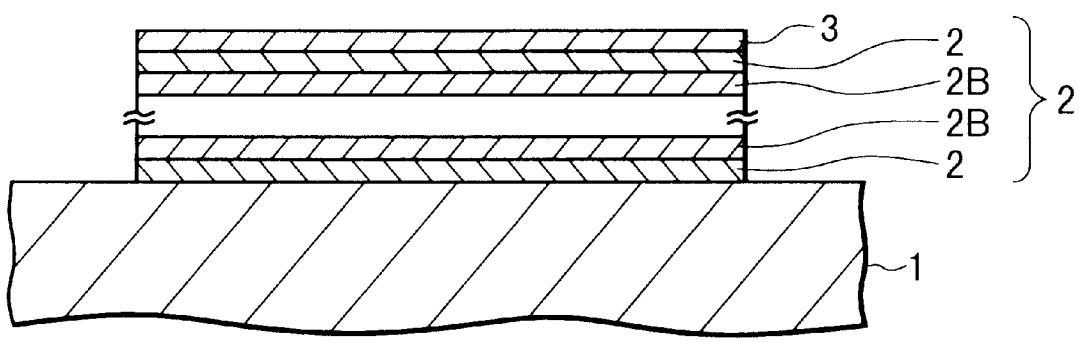

As shown in FIG. 2D, the mask pattern 6 is removed by reactive ion etching (RIE) using $CF_4$. The protective layer 5 of GaAs is removed by using citric acid. In this case, the etching stops at the etching stopper layer 4. Next, the etching stopper layer 4 is removed by using buffered hydrofluoric acid. The surface layer of the exposed strain relaxation layer 3 is sputtered thinly by using argon ions to thereby clean the surface of the strain relaxation layer 3.

Figure 2E:
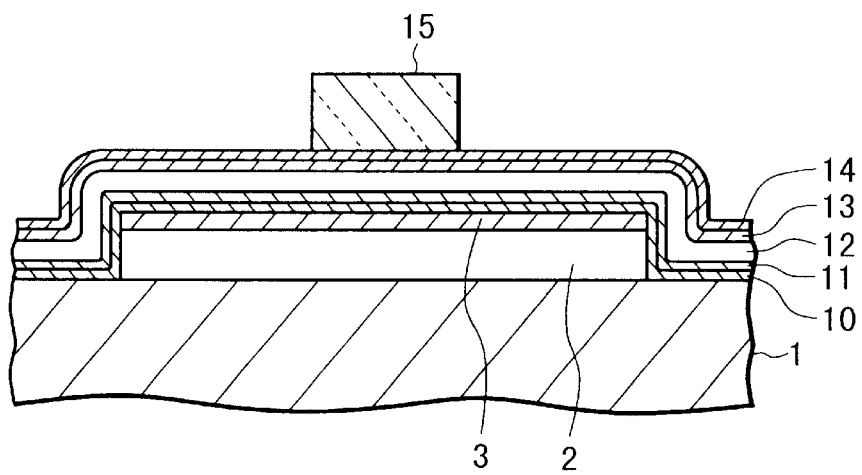
Figure 2F:
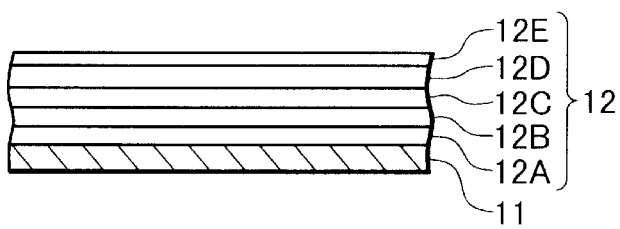

As shown in FIG. 2E, covering the surfaces of the lower DBR mirror 2, strain relaxation layer 3 and GaAs substrate 1, a p-side contact layer 10 of p-type InGaAs, a lower current confinement layer 11 of p-type InAlAs, an active layer 12, an upper current confinement layer 13 of n-type InAlAs, and an n-side contact layer 14 of n-type InGaAs are sequentially grown. As shown in FIG. 2F, the active layer 12 is formed by sequentially depositing an SCH layer 12A of i-type InAlGaAs, a strained quantum well layer 12B of i-type InGaAs, a barrier layer 12C of i-type InAlGaAs, a strained quantum well layer 12D of i-type InGaAs, and an SCH layer 12E of i-type InAlGaAs. These layers can be grown by MBE or MOVPE.

A mask pattern 15 of silicon oxide having a thickness of 200 nm is formed on the upper surface of the n-side contact layer 14 in an area corresponding to generally the central area of the strain relaxation layer 3. The plan shape of the mask pattern 15 is a square having a side length of 30 µm.

Figure 2G:
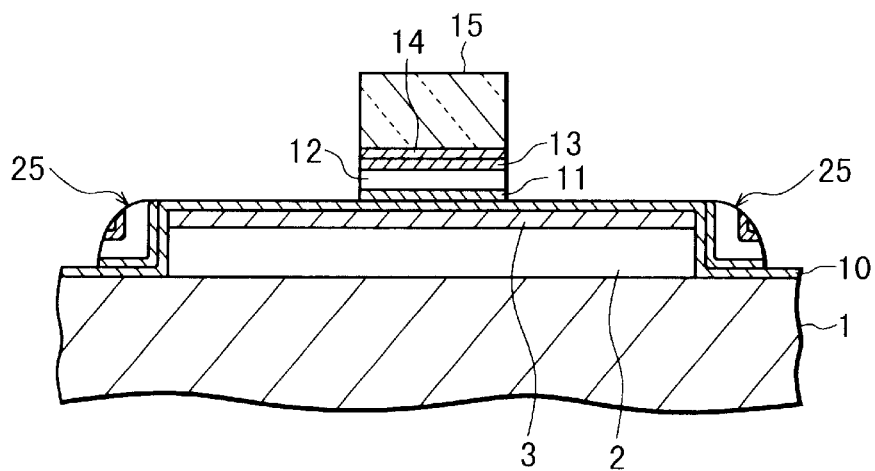

As shown in FIG. 2G, by using the mask pattern 15 as a mask, the substrate is etched until the p-side contact layer 10 is exposed. This etching is performed by RIBE using chlorine gas. The etching depth is controlled by the etching time. A side wall structure made of a partial region of the lamination structure from the lower current confinement layer 11 to the n-side contact layer 14 is left on the side walls of the lower DBR mirror 2 and strain relaxation layer 3.

Figure 2H:
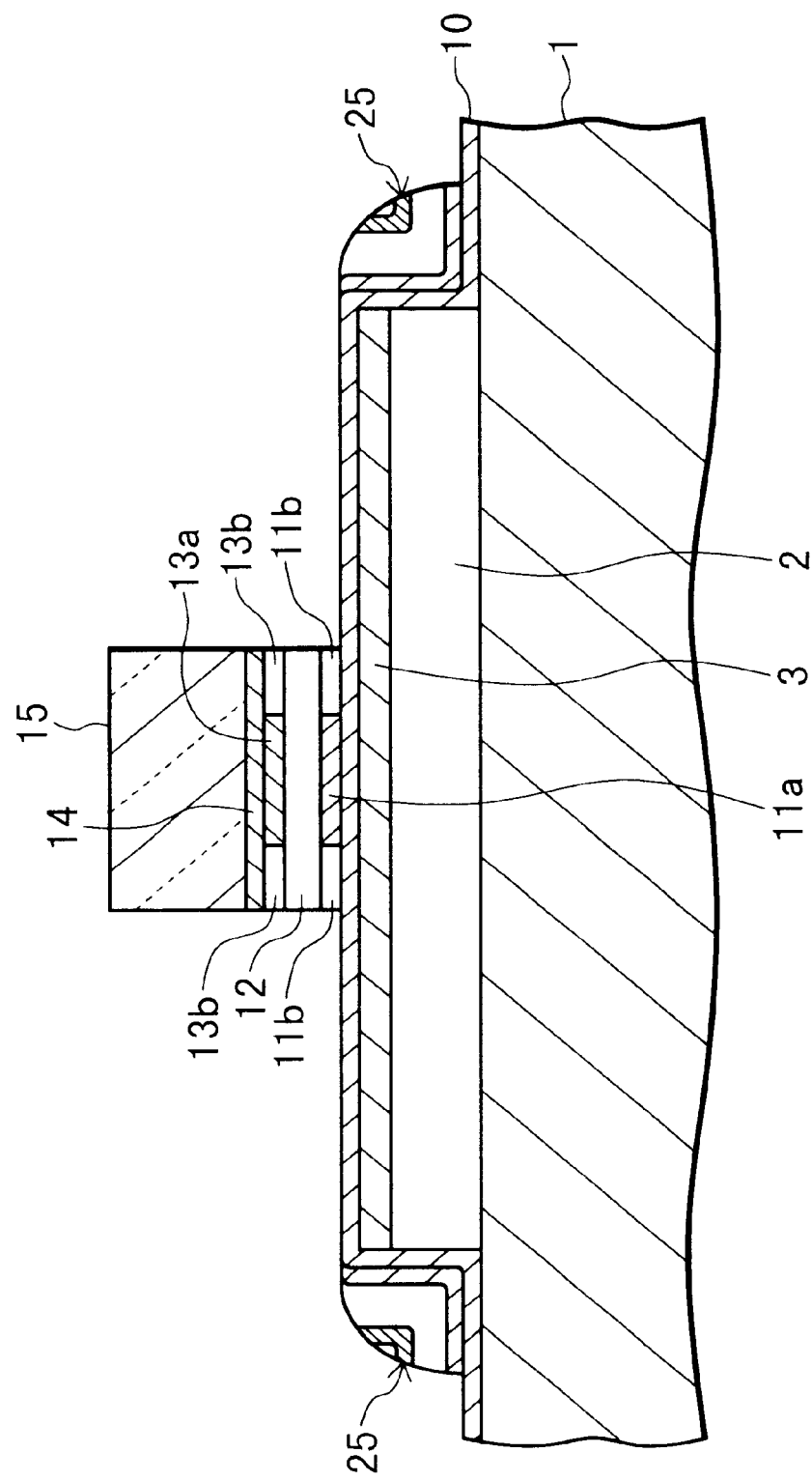

The processes up to the state shown in FIG. 2H will be described. The substrate is placed in a reaction furnace and heated to 460° C. Water vapor is introduced into the reaction furnace by using nitrogen gas as carrier gas. Only the lower current confinement layer 11 and upper current confinement layer 13 of InAlAs are selectively oxidized in the lateral direction from the side faces thereof. The oxidation time is controlled so that the oxidation depth becomes 10 µm. Insulating regions 11b and 13b of oxidized InAlAs are therefore formed in the regions near the outer peripheries of the lower and upper current confinement layers 11 and 13, respectively. Conductive regions 11a and 13a are left in the central regions of the lower and upper current confinement layers 11 and 13, respectively. After this oxidation, the mask pattern 15 is removed by RIE using $CF_4$.

The processes up to the state shown in FIG. 1 will be described. An upper DBR mirror 20 is formed by lift-off on the upper surface of the n-side contact layer 14 in an area corresponding to the conductive region 13a. Electron beam deposition is used for depositing Si layers and $Al_2O_3$ layers constituting the upper DBR mirror 20.

An n-side electrode 21 is formed by lift-off on the upper surface of the n-side contact layer 14 in a frame-shaped area surrounding the upper DBR mirror 20. Vacuum deposition is used for depositing an AuGe alloy layer and an Au layer constituting the n-side electrode 21. A p-side electrode 22 is formed by lift-off on the upper surface of the p-side contact layer 10 in a frame-shaped area surrounding the lower current confinement layer 11. Vapor deposition is used for depositing an AuZn alloy layer and an Au layer constituting the p-side electrode 22.

The lower DBR mirror 2 and upper DBR mirror 20 define an optical resonator including the active layer 12. As a forward voltage is applied across the p-side electrode 22 and n-side electrode 21, holes and electrons are injected into the active layer 12 respectively from the conductive regions 11a and 13a. Laser oscillation at the wavelength of about 1.3 $\mu$m therefore occurs.

In this embodiment, the AlAs layer 2A and GaAs layer 2B shown in FIG. 2B are not lattice-matched with the GaAs substrate 1. Since the strain relaxation layer 3 of InGaAs does not lattice-match the GaAs substrate 1, strains are generated in the strain relaxation layer 3. As the AlAs layer is oxidized at the process of FIG. 2C, strains in the upper strain relaxation layer 3 are relaxed more than strains immediately after the growth of the strain relaxation layer 3. In order to improve the strain relaxation effects, it is preferable that the strain relaxation layer 3 is grown directly on the AlAs layer. The phenomenon that if an AlAs layer is oxidized, strains in the upper layer are relaxed, is described in J. Vac. Sci. Technol. B18(4), 2066–2071, 2000.

A difference between a lattice constant of $In_{0.45}Ga_{0.55}As$ used for the strained quantum well layer and that of $In_{0.27}Ga_{0.73}As$ used for the strain relaxation layer 3 is smaller than a difference between a lattice constant of $In_{0.45}Ga_{0.55}As$ used for the strained quantum well layer and that of the GaAs substrate 1. Strains in the strain relaxation layer 3 are relaxed more than those immediately after it is epitaxially grown on the AlAs layer. Therefore, as compared to that the strained quantum well layer is epitaxially grown on the GaAs substrate, the crystal quality of the strained quantum well layer can be improved. If the strain relaxation amount in the strain relaxation layer is large, it is expected that the crystal quality is obtained which is similar to that when a strained quantum well layer is formed on an InGaAs substrate.

In the above embodiment, binary compound semiconductor GaAs is used as the substrate material. As compared to a substrate made of ternary compound semiconductor or compound semiconductor of more atoms, the heat resistance of a device is smaller so that the heat radiation efficiency in operation of the device can be improved. A high reflectivity DBR mirror can be formed by using semiconductor material lattice matching a GaAs substrate, e.g., GaAs and AlAs.

In the embodiment, although $In_{0.27}Ga_{0.73}As$ is used as the material of the strain relaxation layer 3, other semiconductors having the same lattice constant as $In_{0.27}Ga_{0.73}As$ may be used. For example, InGaAsP may be used as such semiconductor.

As the In composition ratio of InGaAs is made larger, the lattice constant becomes larger and the band gap becomes smaller. The In composition ratio of a strained quantum well layer is determined from the wavelength at which laser oscillation occurs. As the In composition ratio of a strained quantum well layer is determined, a suitable In composition ratio of the strain relaxation layer 3 is decided. The In composition ratio of the strain relaxation layer 3 is selected so that a difference between the lattice constant of the strained quantum well layer and that of the strain relaxation layer 3 becomes smaller than a difference between the lattice constant of the strained quantum well layer and that of the GaAs substrate 1.

If the In composition ratio of the strain relaxation layer 3 is made large to make its lattice constant large, the strained quantum well layer can be made of material having a larger lattice constant. In this manner, a surface emitting semiconductor laser device having a longer oscillation wavelength can be manufactured. Conversely, if the In composition ratio of the strain relaxation layer 3 is made small to make its lattice constant small, a surface emitting semiconductor laser device having a shorter oscillation wavelength can be manufactured.

In the embodiment, although GaAs is used as the substrate material, InP may be used instead of GaAs. In this case, a DBR mirror can be formed by stacking InAlAs layers and InGaAs layers lattice matching InP and by oxidizing the InAlAs layers. An InP layer may be used in place of the InGaAs layer of the DBR mirror.

Oxidation of the InAlAs layer of the DBR mirror relaxes strains in the upper strain relaxation layer more than those immediately after the growth of the strain relaxation layer. If material having a lattice constant larger than that of InP of the substrate is used, a surface emitting semiconductor laser having a longer oscillation wavelength can be manufactured. Conversely, if material having a lattice constant smaller than that of InP is used, a surface emitting semiconductor laser having a shorter oscillation wavelength can be manufactured.

In the above embodiment, although the upper DBR mirror 20 has the lamination structure of Si layers and $Al_2O_3$ layers, it may be made of semiconductor layers with conductivity. For example, the upper DBR mirror may be made of 25 pairs of an n-type $In_{0.27}Ga_{0.73}As$ layer of 97 nm in thickness and an n-type $In_{0.256}Al_{0.744}As$ layer of 106 nm in thickness alternately stacked. Each layer is doped with Si as n-type impurities at a concentration of $2 \times 10^{18}$ cm$^{-3}$.

If the upper DBR mirror is made of semiconductor layers with conductivity, after the n-side contact layer 14 shown in FIG. 2E is formed, the upper DBR mirror is grown in succession. At the process shown in FIG. 2G, the upper DBR mirror together with the underlying lamination structure from the n-side contact layer 14 to the lower current confinement layer 11 is patterned at the same time. The n-side electrode is formed on the uppermost n-type InGaAs layer.

Also in the above embodiment, the luminescence region in the active layer is a strained quantum well layer. The luminescence region may be realized by other structures. For example, the luminescence region may be formed by bulk semiconductors, quantum wires, quantum dots or the like. In this case, the strain relaxation layer under the active layer is made of material having a lattice constant suitable for the underlying layer of the active layer. Since strains in the strain relaxation layer are relaxed, bulk semiconductors, quantum wires and quantum dots of a good quality can be formed.

The present invention has been described in connection with the preferred embodiments. The invention is not limited only to the above embodiments. It is apparent that various modifications, improvements, combinations, and the like can be made by those skilled in the art.

I claim:

1. A surface emitting semiconductor laser device, comprising:

a substrate made of a first semiconductor having a first lattice constant;

a lower multi-layer mirror disposed on a surface of said substrate, said lower multi-layer mirror having a first layer made of an oxide of a second semiconductor and a second layer made of a third semiconductor alternately stacked;

a strain relaxation layer disposed on said lower multi-layer mirror and made of a fourth semiconductor having a second lattice constant different from the first lattice constant;

an active layer including a luminescence region disposed on said strain relaxation layer and made of a fifth semiconductor having a third lattice constant different from the first lattice constant; and an upper multi-layer mirror disposed on said active layer.

2. A surface emitting semiconductor laser device according to claim 1, wherein a difference between the second and third lattice constants is smaller than a difference between the first and third lattice constants.

3. A surface emitting semiconductor laser device according to claim 1, wherein an uppermost layer of said lower multi-layer mirror is the first layer, and said strain relaxation layer is in contact with the first layer.

4. A surface emitting semiconductor laser device according to claim 1, wherein the fourth and fifth semiconductors are a compound semiconductor having three or more elements, said fourth and fifth semiconductors having a same elements and having different composition ratios.

5. A surface emitting semiconductor laser device according to claim 4, wherein the fourth and fifth semiconductors are InGaAs.

* * * * *